(12) United States Patent
Hochapfel et al.

(10) Patent No.: US 8,959,308 B2
(45) Date of Patent: Feb. 17, 2015

(54) DEVICE AND METHOD FOR MONITORING AND USING INTERNAL SIGNALS IN A PROGRAMMABLE SYSTEM

(75) Inventors: Erik Hochapfel, Massy (FR); Pascal Remy, Paris (FR)

(73) Assignee: Adacsys, Palaiseau (FR)

( * ) Notice: Subject to any disclaimer, the term of this patent is extended or adjusted under 35 U.S.C. 154(b) by 187 days.

(21) Appl. No.: 12/918,794

(22) PCT Filed: Feb. 17, 2009

(86) PCT No.: PCT/FR2009/000173
§ 371 (c)(1),
(2), (4) Date: Aug. 20, 2010

(87) PCT Pub. No.: WO2009/115680
PCT Pub. Date: Sep. 24, 2009

(65) Prior Publication Data
US 2010/0332742 A1    Dec. 30, 2010

(30) Foreign Application Priority Data

Feb. 22, 2008   (FR) ...................................... 08 51154

(51) Int. Cl.
*G06F 12/00*    (2006.01)
*G01R 31/3185*    (2006.01)

(52) U.S. Cl.
CPC .............................. *G01R 31/318516* (2013.01)
USPC ................................. 711/170; 711/5; 711/167

(58) Field of Classification Search
USPC ............................................. 711/5, 167, 170
See application file for complete search history.

(56) References Cited

U.S. PATENT DOCUMENTS

| | | | |
|---|---|---|---|
| 5,764,079 A | 6/1998 | Patel et al. | |
| 6,157,210 A | 12/2000 | Zaveri et al. | |
| 6,681,353 B1* | 1/2004 | Barrow ........................ | 714/725 |
| 2006/0006243 A1* | 1/2006 | Papadopoulos et al. ...... | 235/492 |
| 2006/0038586 A1* | 2/2006 | Xia et al. ........................ | 326/39 |
| 2009/0021991 A1* | 1/2009 | Miyamoto et al. ..... | 365/189.011 |
| 2009/0257445 A1* | 10/2009 | Chan et al. .................... | 370/463 |

FOREIGN PATENT DOCUMENTS

EP             1 233 341 A1      8/2002

* cited by examiner

*Primary Examiner* — Gurtej Bansal
(74) *Attorney, Agent, or Firm* — Arent Fox LLP

(57) ABSTRACT

The invention relates to a device for monitoring and using internal signals in a programmable system (2), wherein said device includes at least one programmable system (2) including at least one programmable circuit (10, 20, 30), and at least one host system (3) capable of communicating with said programmable system for controlling the monitoring and the use of internal signals in at least one programmable circuit, characterized in that the device further comprises at least one local storage unit (12, 22, 32), at least one control and data-exchange logic unit (4) controlled by a host system, and at least one processing and control unit (8) connected to the at least one host system for communication between the associated host system and at least one storage unit, and for indexing the internal signals of each programmable circuit associated with at least one interface relative to each storage unit.

17 Claims, 5 Drawing Sheets

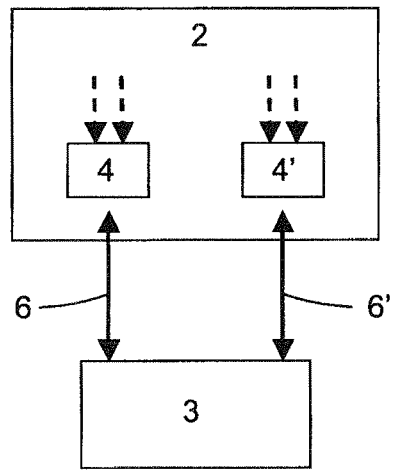
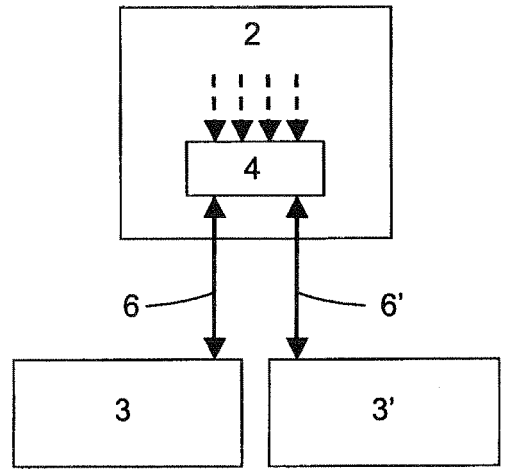
Figure 3    Figure 4
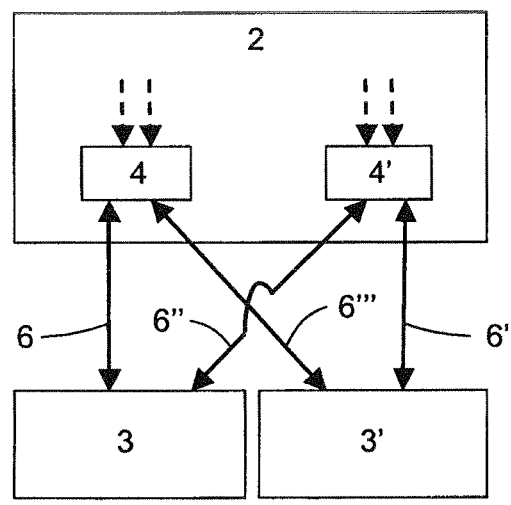
Figure 5

DEVICE AND METHOD FOR MONITORING AND USING INTERNAL SIGNALS IN A PROGRAMMABLE SYSTEM

CROSS-REFERENCE TO RELATED APPLICATION

This application is a National Stage entry of International Application No. PCT/FR2009/000173 filed Feb. 17, 2009, which claims priority to French patent application Ser. No. 08/51154 filed Feb. 22, 2008. The disclosure of the prior applications is hereby incorporated in their entirety by reference.

The present invention concerns a device and method for observing and using internal signals in a programmable system.

TECHNICAL FIELD

The present invention concerns the field of programmable logic circuits.

It concerns more particularly devices and methods for observing and using internal signals in a programmable system consisting of at least one programmable circuit.

PRIOR ART

The prior art comprises programmable logic circuits of the PLD (SPLD or CPLD) and FPGA type. These circuits make it possible to access a very high calculation capacity because of the intrinsically parallel processing of the instructions that is used, compared with computer architectures of the CISC or RISC type, for which these processing operations are sequential.

A programmable system is then designed as an assembly formed by one or more programmable logic circuits, these circuits possibly being able to be interconnected.

So that the use and exploitation of such a system can be implemented in an optimum fashion, it is necessary to be able to ensure the observability of the internal signals of the programmable circuits making up this system. The observability of the internal systems consists of knowing the value of these signals.

This observability reveals several problems, including:
the small number of input/output connectors compared with the ever increasing internal capacity of programmable circuits,
the disappearance of a not insignificant number of data of a description implemented in one or more programmable circuits. These data consequently cannot be observed and therefore used since they do not have associated internal signals,
the transfer of the values of the internal signals of a programmable circuit, between a programmable circuit and one or more other programmable circuits and/or electronic elements, and
the transfer of the values of the internal signals of one or more programmable circuits between programmable circuits, and/or between one or more programmable circuits and a "host" electronic system (computer or other) enabling them to be used instantaneously or subsequently.

Among these various problems, the last one—of transfer of the values of the internal signals of one or more programmable circuits between one or more programmable circuits and a host electronic system—limits the speed at which the values of the internal signals can be observed.

To solve this problem of transfer of the values of the internal signals between one or more programmable circuits and a host system, the prior art comprises several devices and methods for obtaining partial observability of the internal signals of the programmable circuits. These solutions consist of the recovery of the values of the internal signals on a host system enabling them to be used.

A general principle consists of recovering the values of the internal signals on the workstation that controls the programmable circuits during use.

The prior art consists of using a special interface for recovering the values of the internal signals. The connection can be made for example by means of a JTAG serial port or a proprietary high-rate interface. One embodiment of this solution is described in the U.S. Pat. No. 6,157,210, which relates to a programmable logic device comprising a circuit. This circuit can be used for observing internal signals of programmable logic circuits with a view to the functional verification of specific circuits implemented on a programmable circuit. It can also be used for the preloading of programmable logic circuits. Other solutions are also described according to this principle in the U.S. Pat. No. 6,286,114 and U.S. Pat. No. 7,078,929.

The drawback of these solutions of the prior art lies in the need to have physically all or a very large proportion of the values of the internal signals of the programmable circuits in the host system in order to be able to use them. These values are thus stored either on a volatile memory, or on a storage unit—internal or external—belonging to the host system. This need causes the appearance of a bottleneck at the connection between the programmable system and the host system, as well as between the various programmable circuits of the programmable system, all the more so when the system comprises a large number of programmable circuits. A programmable system is in this regard defined as a system comprising at least one programmable or reprogrammable part containing one or more programmable circuits.

In addition, these solutions, in order to be able to be rapid and optimum, require a storage capacity for the values of the signals to be observed that is very appreciably greater than that available on the programmable system.

Other solutions of the prior art aim to improve communication between the programmable system and the host system for the purpose of accelerating the data stream per unit of time between these entities.

In all these solutions, the ratio between the quantity of values of the internal signals to be observed and used and the capacity of the communication channel or channels is such that this makes it the limiting factor of the assembly making up the programmable system and host system. This limiting factor corresponds to the operating speed of the assembly formed by the programmable system and the host system, independently of the operating speed of the various components of this assembly, which is all the more significant in real-time operation.

Thus this limitation prevents the obtaining of a sufficient operating speed of the assembly if the programmable circuits have a large number of internal signals to be observed.

OBJECT OF THE INVENTION

The aim of the present invention is to remedy these technical problems, by affording the observability of the internal signals of the programmable circuits without suffering any bottleneck with regard to communication between the programmable system and the host system. For this purpose the invention proposes not obligatorily repatriating all or some of the values of the internal signals, not only during the period of execution but also subsequently, when these data are actually used.

The approach of the solution consists of firstly seeking a hardware architecture, based on programmable circuits, optimised for the use of the values of the internal signals to be observed in the programmable circuits. This search resulted in the addition of a physical storage unit of the volatile memory type to each programmable circuit, reducing the bottleneck and locally keeping all or some of the values of the signals to be observed.

The search for means of using the values of these signals stored on the volatile memories then led to foreseeing the possibility of performing all the processing operations necessary for using these signals, unlike the solutions of the prior art, by leaving them on the programmable system and establishing the requests from the host system.

The invention thus aims to perform all or some of the processing operations necessary for the use of the signals to be observed locally, at the programmable system, by the use of storage units, each storage unit being connected to one or more programmable circuits of the programmable system.

For this purpose, the present invention proposes a device for observing and using internal signals in a programmable system, the said device consisting of a programmable system comprising at least one programmable circuit and at least one host system able to communicate with the said programmable system for controlling the observation and use of the internal signals in at least one programmable circuit, characterised in that it also comprises:

- at least one local storage unit, each storage unit being connected via at least one interface to at least one programmable circuit,
- at least one logic unit for controlling and exchanging data between at least one host system and at least one interface as well as at least one programmable circuit associated with at least one interface, the observation and use of the internal signals of each programmable circuit connected to at least one logic unit for controlling and exchanging data being controlled by a host system and implemented from at least one associated storage unit, and
- at least one processing and control unit connected to at least one host system, each processing unit comprising means of communication between the associated host system and at least one storage unit and means of indexing the internal signals in each programmable circuit associated with at least one interface with respect to each storage unit.

Such a device affords complete observation and use by the host system of the values of the internal signals to be observed in at least one programmable circuit, these being stored on a medium internal to the programmable system controlled by the programmable system and by the host system. Thus the observation and complete use of the internal signals directly on the storage units saves on the repatriation time for all or some of the values of the internal signals to be observed on the host system.

According to advantageous embodiments:

- at least one processing and control unit also comprises means of processing the values of the internal signals in at least one programmable circuit,
- the means of processing the said values of the internal signals also perform the recovery of the ranges of values of signals stored on at least one storage unit,
- the means of processing the said values of the internal signals also perform at least one operation on the values of the signals stored on at least one storage unit,
- the means of processing the said values of the internal signals also perform the consolidation of operations performed using the values of signals stored on at least one storage unit.

These embodiments allow the complete use of the values of the internal signals entirely on the storage units, while acting as quickly as if they were already stored on the host system.

In the case where the device comprises at least two storage units, the processing of the said internal signals is advantageously performed in parallel on at least two storage units. The device is thus made capable of performing the various processing operations on the various programmable circuits even more rapidly.

Where the device comprises at least two programmable circuits, at least two programmable circuits are advantageously connected via an interconnection network. The programmable circuits can in this way communicate data with each other, for example in order to equitably distribute the processing load for the data to be processed on each of them and to make consolidations.

Where the device comprises at least two interfaces, at least two interfaces are advantageously connected via an interconnection network. This interconnection allows an exchange of data directly between the storage unit, by means of the interfaces.

According to a particular embodiment of the invention, each programmable circuit in a programmable system is associated, via at least one interface, with at least one storage unit. All the data in each programmable circuit in the system can thus be stored on a storage unit, which makes it possible to observe and use all the data in all the circuits.

According to another particular embodiment, in the case where the device comprises at least two programmable circuits, at least two programmable circuits among the at least two programmable circuits are connected to the same storage unit via the same interface. It is thus possible to have a number of programmable circuits greater than the number of storage units, while enabling the data in each circuit to be observed and used.

According to another particular embodiment, the programmable system also comprises at least one processor equipped with a logic control unit for performing specific tasks. These system thus has available integrated circuits capable of performing several tasks at the same time and performing specific tasks very quickly, which further improves the operating speed of the device.

According to another particular embodiment, at least one programmable circuit comprises at least one routing placement means for at least some of the programmable circuits, so as to distribute them over the entire system and reduce the porting time, that is to say the adaptation of a programme in an environment other than its original environment.

In a particular embodiment of the invention, at least part of at least one storage unit is used for storing at least one stimulus in order to excite at least one signal among the internal signals in the programmable circuits and an input of a processor. A stimulus corresponds to all the values that a signal can take over time. It makes it possible to stimulate the internal signal of the programmable circuit of the programmable system to which it refers and in which it is situated. Each stimulus is loaded into a storage unit and then recovered in order to stimulate the corresponding internal signal in the programmable circuit in which it is situated.

Preferentially, at least one storage unit is of the volatile memory type. The storage units thus formed are therefore able to renew the content of the stored data and require reduced storage capacities compared with other types of physical memory.

Preferentially, at least one connection among the connections between the elements making up the device is a fast connection with a rate greater than 1 gigabit/second.

The data exchanges can thus take place more rapidly between the elements concerned, which is particularly advantageous in the case of connections between programmable circuits and storage units.

According to a particular embodiment, at least one connection among the connections between the elements making up the device is a wireless connection. It is thus no longer necessary for the elements concerned to be sufficiently close, and in addition the space taken up by the connection cables is reduced.

The invention also concerns a method of observing and using internal signals in a programmable system, the said device consisting of a programmable system comprising at least one programmable circuit and at least one host system able to communicate with the said programmable circuit for controlling the observation and use of the internal signals and at least one programmable circuit, the said method using such a device for observing and using internal signals in a programmable system.

BRIEF DESCRIPTION OF THE DRAWINGS

The invention will be understood more clearly from the reading of the detailed description of a non-limitative example embodiment, accompanied by figures showing respectively.

DETAILED DISCLOSURE OF PARTICULAR EMBODIMENTS

Hereinafter, a programmable system will be defined as a system comprising at least one programmable or reprogrammable part containing one or more programmable circuits. A programmable circuit will be defined here as a programmable logic integrated circuit that may be reprogrammable or not after manufacture thereof. In addition, observation (and respectively use) of the internal signals will hereinafter be taken to mean the observation (and respectively the use) at a given instant of the values of these signals.

Figure 1:
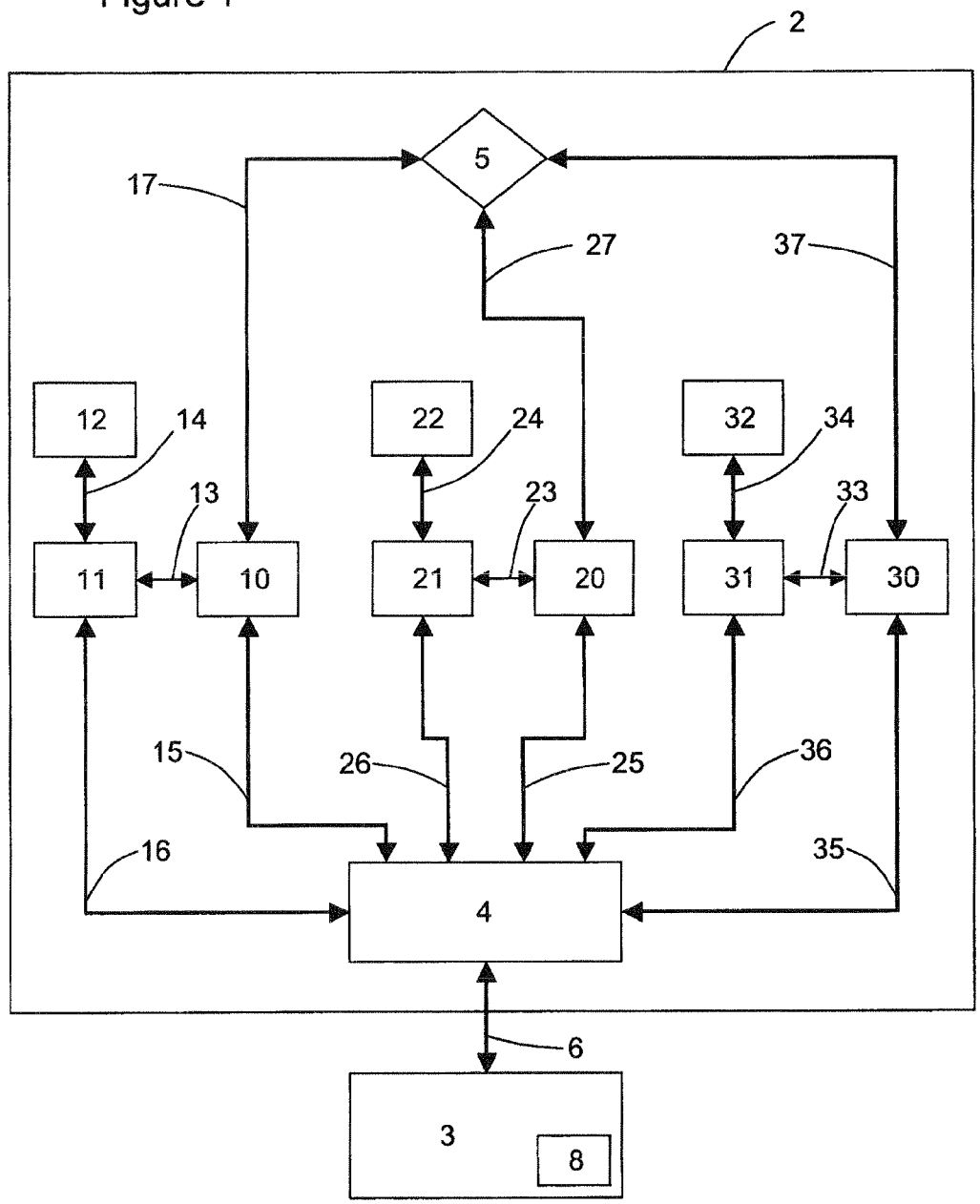
FIG. 1, a device for observing and using signals in a programmable system according to a first embodiment of the invention, FIG. 2, a method of designing an algorithm on a programmable system, with a view to acceleration thereof, in accordance with an embodiment of the invention, FIG. 3, a device according to a second embodiment of the invention, FIG. 4, a device according to a third embodiment of the invention, FIG. 5, a device according to a fourth embodiment of the invention, FIG. 6, a device according to a fifth embodiment of the invention, FIG. 7, a device according to a sixth embodiment of the invention, FIG. 8, a device according to a seventh embodiment of the invention, FIG. 9, a device according to an eighth embodiment of the invention.

FIG. 1 shows a device for observing and using the signals in a programmable system in accordance with a first embodiment of the present invention.

This device comprises a programmable system 2 and a host system 3. The host system 3 is an electronic system able to communicate with the programmable system 2. It is connected to a processing and control unit 8, which may for example be a computer. This unit 8 may be offset or disposed inside the said host system 3.

The programmable system 2 comprises three programmable logic circuits 10, 20, 30. The invention may of course be implemented with a different number of programmable circuits. These programmable circuits may for example be FPGA (field-programmable gate array) circuits or PLD (programmable logic device) circuits, wherein the latter may be simple (SPLD) or complex (CPLD).

Each programmable circuit 10, 20, 30 comprises a plurality of internal signals that the device according to the invention aims to observe and use.

Preferentially, these programmable circuits 10, 20, 30 are connected to one another by an interconnection network 5, via respectively the connections 17, 27, 37. This network 5 may contain logic, such as for example control and switching logic.

Each programmable circuit 10, 20, 30 is associated respectively with a local information storage unit 12, 22, 32 via an interface 11, 21, 31. Each information storage unit 12, 22, 32 stores the values of the signals internal to the associated programmable circuit 10, 20, 30. It is connected to each interface 11, 21, 31 via a connection 14, 24, 34.

Each interface 11, 21, 31 connects a programmable circuit 10, 20, 30 to an information storage unit 12, 22, 32. These interfaces may be of different natures, for example of a logic, physical, IP or other nature. It is connected to each storage unit 12, 22, 32 via a connection 14, 24, 34 and to each programmable circuit 10, 20, 30 via a connection 13, 23, 33.

The programmable system 2 also comprises a data control and exchange logic unit 4. This logic unit 4 is connected to each programmable circuit 10, 20, 30 via a connection 15, 25, 35, and to each interface 11, 21, 31 via a connection 16, 26, 36. This logic unit 4 can thus access the programmable circuits and the other values of the internal signals in these programmable circuits by means of the interfaces.

The host system 3 communicates with the programmable system 2 by means of the logic unit 4. This communication is established via the connection 6, which performs the exchange of data between the two systems 2, 3.

The processing and control unit 8 makes it possible to observe and use the signals of at least one programmable circuit 10, 20, 30 chosen by the user of the host system 3. This processing and control unit comprises for this purpose several means, including:

instrumentation means for the programmable circuit with a view to communicating with each storage unit 12, 22, 32 associated with each circuit 10, 20, 30 to be observed, means, coupled to the said instrumentation means, of indexing all the internal signals to be observed, means of processing the values of these signals, for performing operations distributed over all the associated storage units 12, 22, 32.

The processing of these signals by the said processing means depends on the application to which the device relates. It may also perform several processing operations among the following:

the recovery of ranges of values of signals stored on one or more associated storage units 12, 22, 32, operations on the values of signals stored on one or more associated storage units 12, 22, 32, and the consolidation of operations performed using the values of signals stored on one or more associated storage units 12, 22, 32.

By means of the logic unit 4, each interface 11, 21, 31 and each storage unit 12, 22, 32, the host system 3 is thus able to control the observation and use of the internal signals in the programmable circuits 10, 20, 30 without having first to load all these values on this system. The observation and use takes place in fact directly on each storage unit 12, 22, 32 rather than from the host system 3.

For this purpose, the creation of an index, or of a hash table, by the program for observing and using the internal signals in the programmable system 2, makes it possible to know in which storage unit 12, 22, 32 the value of any signal to be observed, internal to a programmable circuit 10, 20, 30, is situated, in order to use this value directly on the storage unit associated with this programmable circuit.

In addition, the technique used for storing data in the storage units 12, 22, 32 so as to be close to those of the entities that host them and possibly manipulate them. This makes it possible to use these data in parallel and locally, much more rapidly than if they were stored on the host system 3.

After the processing operations performed by the processing and control unit 8 and controlled by the host system 3, such as for example operations on the values of the signals to be observed, this host system will be able to request the repatriation of the values of the consolidated results directly on the host system. Thus the connection 6 between the host system and the programmable system 2 performs only the exchange of data selected by the host system, these data having been the subject of processing on the storage units 12, 22, 32. The connection 6 is consequently made less encumbered than if the host system repatriated all the data in order to process them at its level, and the speed of functioning of the device is made all the greater.

Such a device can be used for various applications, including the acceleration of algorithms, the functional checking of integrated circuits, and high-performance calculation. The acceleration of algorithms can be used in various fields, such as for example fluid mechanics, seismography, biocomputing, or for graph and hypergraph optimisation problems, in particular for sales representatives, scheduling or resources. Functional checking may concern integrated circuits, systems on chip, programmable circuits (PLD or FPGA) or algorithms.

Figure 2:
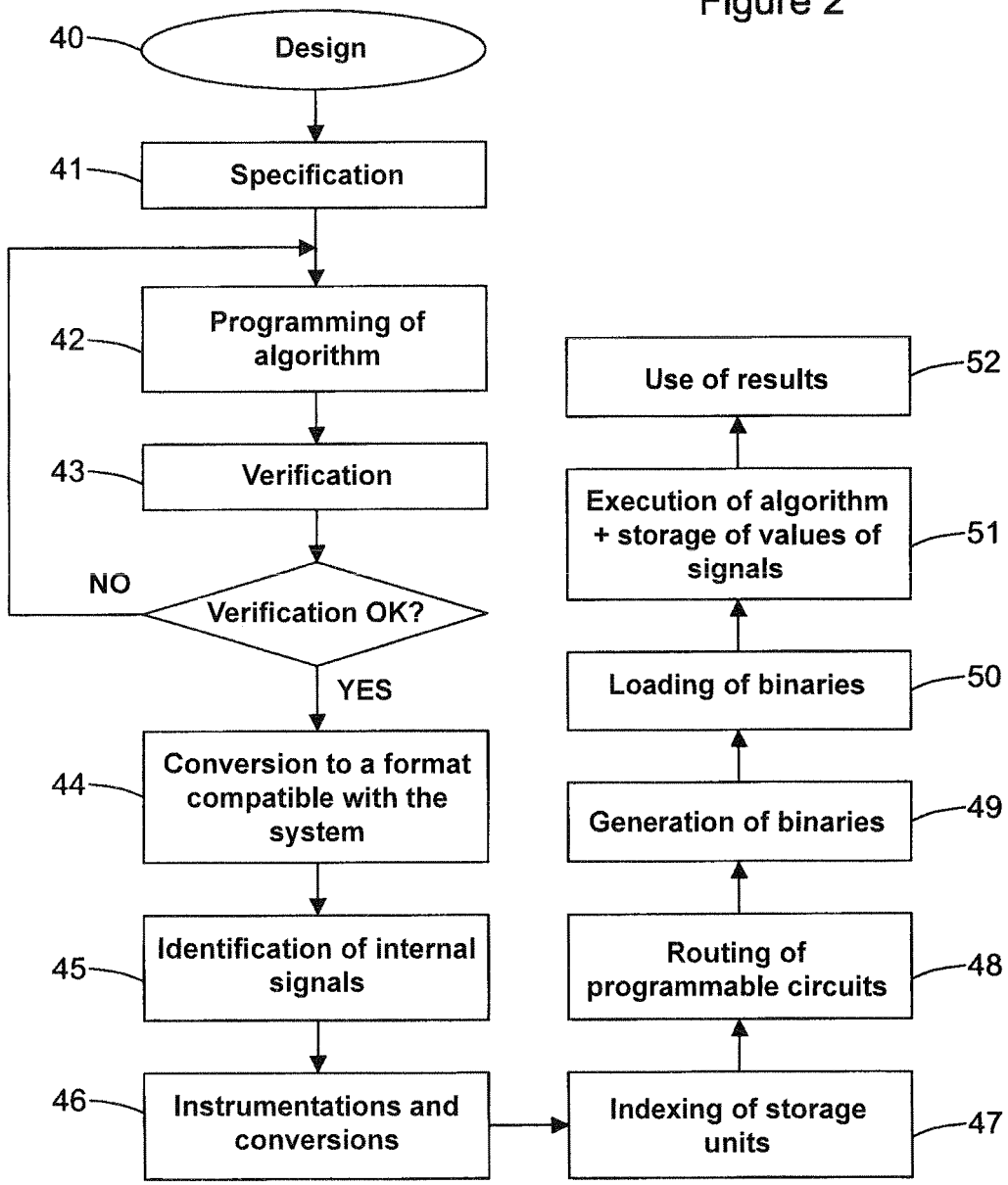

FIG. 2 shows a method of designing an algorithm on a programmable system, with a view to acceleration thereof, in accordance with one embodiment of the present invention.

This design method 40 aims to implement an algorithm on a programmable system, with a view to acceleration thereof compared with a computer of the RISC or CISC type. The observation and use device utilised is identical to that described previously and illustrated by FIG. 1. The host system is here a computer of the RISC or CISC type, which makes it possible to initiate requests in the direction of the programmable system. The programmable circuits are of the FPGA type.

After a first phase of writing the functional specifications 41 of the algorithm, the application programming phase 42 can commence. This algorithm is described in a programming language, for example the C/C++ language. In other embodiments, it can be implemented for example in HDL or Fortran language.

Following this programming step, the functioning of the algorithm is checked 43 on a reduced test set by compiling it on an RISC or CISC architecture. If the result of the check is not compliant, the programming phase 42 is repeated, and then the check phase 43, until a compliant result is obtained.

Software for translating the algorithm in C language into HDL language and thus enabling it to be implemented in an FPGA circuit achieves the conversion 44 of the algorithm to a format compatible with the target programmable system. To this end, this software converts C language into an HDL language compatible with the programmable circuits used by the target programmable system. It is executed on all the files constituting the programming 42 of the algorithm.

The user can then proceed with the declaration 45 of a series of variables that he wishes to exploit for the purpose of checking. Each variable coded in more than one bit corresponds to aggregates of signals internal to the programmable circuits.

The declaration 45 gives rise to an instrumentation that is performed by one of the software packages or a software function of the instrumentation and conversion phase 46. This instrumentation and conversion phase 46 is implemented by a set of software or software functions and makes it possible to obtain a description of the algorithm compatible with the hardware architecture of the programmable system 2 composed of the programmable circuits.

This instrumentation and conversion phase 46 comprises:
instrumentation for observing the signals declared at 45,
a partitioning step, which distributes the converted algorithm over all the programmable circuits of the target programmable system 2,
a step of adding blocks for the future use of the internal signals that the user wishes to observe and use, and
a step of initialising the memories of the target programmable system.

This instrumentation and transformation phase 46 can be supplemented by other steps additional to those described above with a view to improving the performance of the algorithm.

An indexing phase 45 next makes it possible to know on which physical memory resource the internal signals previously identified as having to be used are situated. For this purpose an index is constructed associating with each identifying signal the storage unit on which it is in memory. This indexing is followed by a routing placement phase 48 for each programmable circuit. Then, for each programmable circuit, programming binaries are generated in the form of one binary programming file per programmable circuit, during the generation phase 49. These binary files obtained previously are then loaded into each programmable circuit during the loading phase 50.

The user can consequently proceed with the execution 51 of the algorithm on the programmable system. This execution phase is coupled with the storage of the values of the internal signals to be used in each programmable circuit on each storage unit associated with the corresponding programmable circuit. At the end of the execution 51 of the algorithm on the programmable system, all the values of the signals to be exploited are thus situated on the storage units.

Finally, at the end of this phase 51, the user can proceed with the use 52 of the results of the execution of the algorithm on the programmable system. This use is achieved by means of a sending of requests to the programmable system by the user, by means of the connection 6 between the host system 3 and the programmable system 2.

These requests can for example consist of the display of a set of signals in a window, the values being loaded on request, or the comparison of signals with a reference, this comparison being able to take place either on the computer, or directly on the programmable system if the reference has previously been loaded on the latter.

Such a method of designing an algorithm using a programmable system, associated with such a device for observing and using internal signals of this programmable system, makes it possible to obtain a processing of the algorithm that is quicker than in the case where the latter is processed by a computer of the CISC or RISC type.

Other variant embodiments of the device according to the present invention can be used as described below.

According to the embodiment illustrated by FIG. 3, the programmable system 2 comprises two logic data control and exchange units 4, 4'. Each logic unit 4, 4' is connected to the host system 3 by a connection 6, 6'. Each of the two logic units 4, 4' is also connected to a plurality of programmable circuits, each programmable circuit being connected to only one of the two logic units 4, 4'. Each logic control unit and the programmable circuits that are connected thereto thus constitute a programmable sub-assembly. Such a device thus makes it possible to produce a multicard programmable system, consisting of a plurality of programmable sub-systems, this system having a greater capacity and having potentially increased functionalities since it has more logics and circuits.

This variant can also be implemented with a programmable system consisting of a number of logic units 4, 4'—and therefore programmable sub-systems—greater than 2.

According to the embodiment illustrated by FIG. 4, the observation and use device consists of two host systems 3, 3'. Each host system is connected to the programmable system 2 by a connection 6, 6'. Such a device makes it possible to give several host systems access to the data, the said host systems being able to send observation and use requests to the programmable system independently of one another. This variant can also be implemented with a number of host systems greater than two.

According to the embodiment illustrated by FIG. 5, the programmable system 2 consists of two logic units 4, 4' and two host systems 3, 3'. Each of the logic control units 4, 4' is connected to each of the host systems 3, 3' by a connection 6, 6', 6", 6'". This variant combines the advantages provided by the previous two variants illustrated by FIGS. 3 and 4. It can also be implemented with a number of programmable sub-systems and host systems greater than two.

Figure 6:
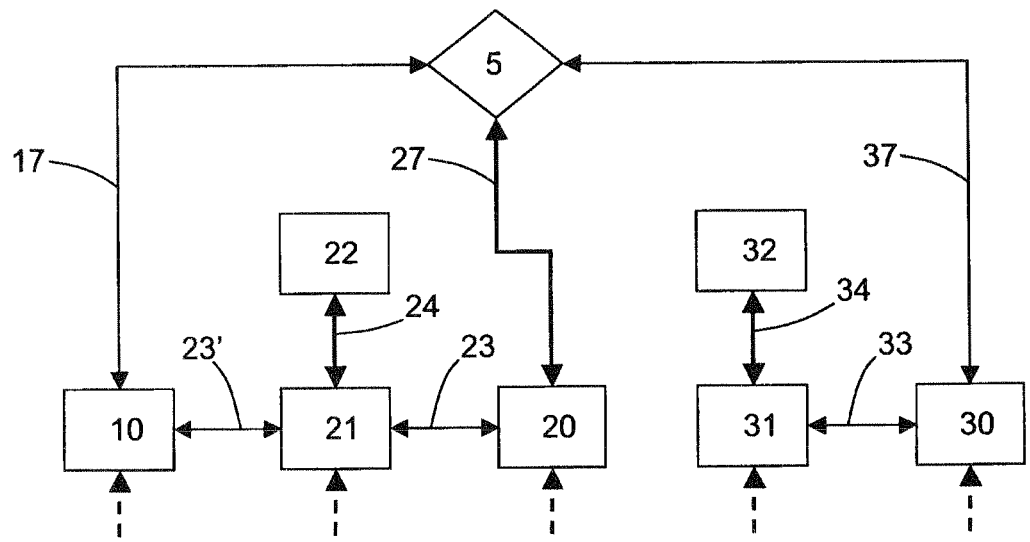

According to an embodiment illustrated by FIG. 6, the programmable circuits 10 and 20 are associated with the same storage unit 22 via the interface 21. The storage unit 22 is thus interconnected with the two programmable circuits 10 and 20. Such a device then makes it possible to reduce the number of storage units without limiting the operating speed of the device, this number of storage units 22, 32 being able to remain less than the number of programmable circuits 10, 20, 30, while all the programmable circuits 10, 20, 30 are connected to at least one storage unit 22, 32. This nevertheless requires the storage unit 22 to have sufficient physical memory to accept the data coming from the two circuits 10, 20.

This variant can also be implemented with a storage unit connected to more than two programmable circuits, if the physical memory of this unit so permits. This type of variant can also be implemented by connecting a programmable circuit and several storage units, or by connecting several programmable circuits to several storage units, the number of programmable circuits and storage units being different.

Figure 7:
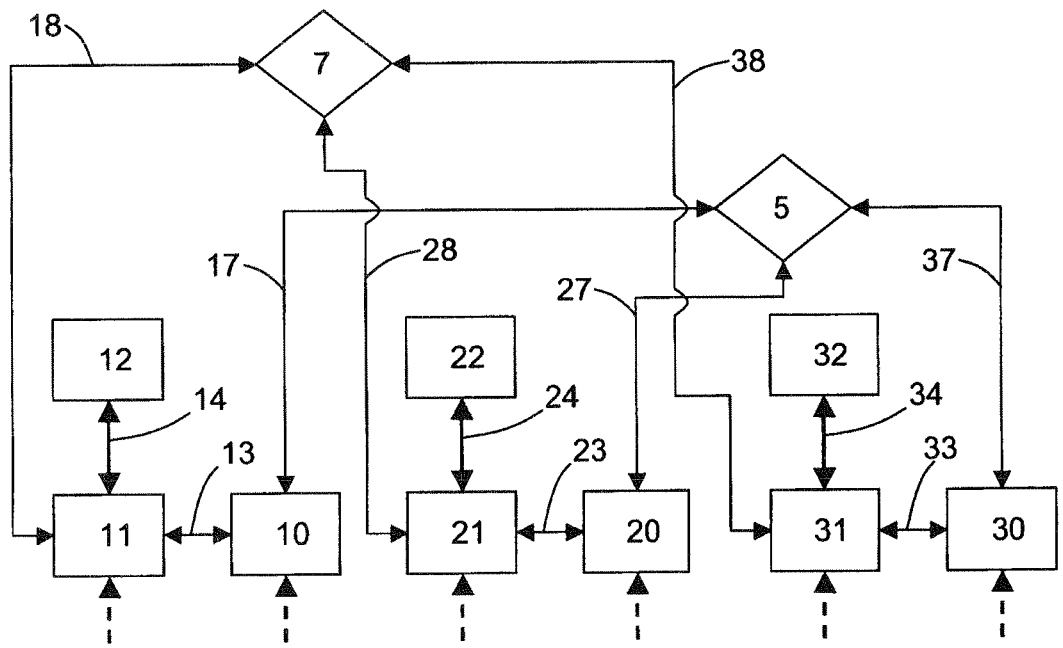

According to the embodiment illustrated by FIG. 7, the interfaces 11, 21, 31 are interconnected via an interconnection network 7, by means of connections 18, 28, 38. This interconnection enables the interfaces to communicate with each other and consequently to make data exchanges between the storage units directly.

Figure 8:
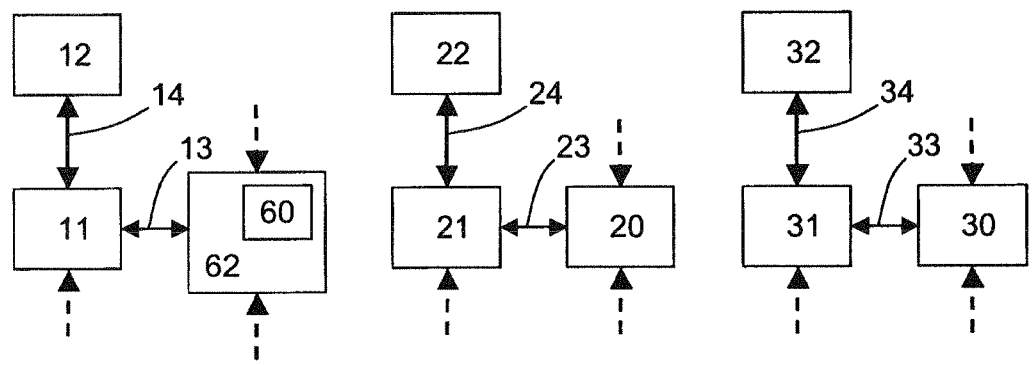

According to the embodiment illustrated by FIG. 8, the programmable circuit 10 has been replaced by a processor 60 equipped with control logic 62. This processor may for example be of the CPU (central processing unit) or GPU (graphics processing unit) type or of the cell processor type. More generally, it may be a specific processor dedicated to one or more tasks. This variant can also be implemented by replacing several programmable circuits with several processors, more particularly by replacing each programmable circuit with a processor.

Figure 9:
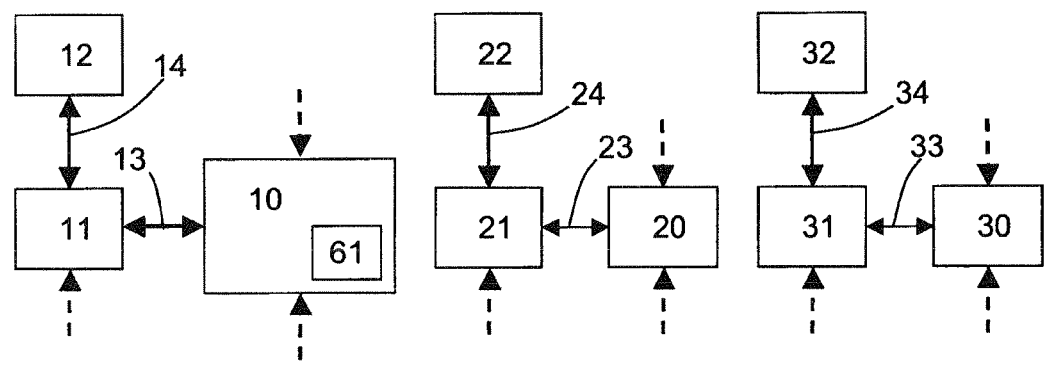

According to the embodiment illustrated by FIG. 9, the processor 61 is included in the programmable circuit 10. This variant can also be implemented by adding several processors to the same programmable circuit. It can also be implemented by adding a processor to several programmable circuits, more particularly by adding a software or hardware processor core to each programmable circuit. The latter variant offers the possibility of effecting a routing placement of the programmable circuits so as to be distributed over the entire system, and therefore greatly reducing the porting time. It also makes it possible to distribute all the calculations relating to the use of the values of the internal signals.

In a particular embodiment of the invention, at least part of at least one storage unit 12, 22, 32 is used for storing at least one stimulus in order to excite a signal among the internal signals in the programmable circuits 10, 20, 30 and/or an input of a processor 60, 61. A stimulus corresponds to all the values that can be taken by a signal over time. It makes it possible to stimulate the internal signal in the programmable circuit 10, 20, 30 of the programmable system 2 to which it refers and in which it is situated. Each stimulus is loaded into a storage unit 12, 22, 32 and then recovered in order to stimulate the corresponding internal signal in the programmable circuit 10, 20, 30 in which it is situated.

In each of the embodiments of the invention described above, the connections between the various elements making up the device may be connecting cables or wireless connections (for example WiFi). These cables are preferentially low noise and high rate, such as for example T10 or T100 cables, with a rate at least greater than 1 gigabit/second, connections of the LVDS type, or optical fibres.

A variant may also consist of using several types of different connections in the same device, according to the requirements in terms of quantities of data to be exchanged between the elements.

The devices according to any one of these embodiments may also apply to a system that is not necessarily fully reprogrammable. This is because it is possible according to any one of these embodiments to apply to a specialised system that is not reprogrammable, or partly reprogrammable and containing one or more non-reprogrammable or non-programmable circuits.

The embodiments described above of the present invention are given by way of examples and are in no way limitative. Naturally a person skilled in the art is in a position to implement different variants of the invention without for all that departing from the scope of the patent.

The invention claimed is:

1. A device for observing and using internal signals in a programmable system, the device consisting of a programmable system comprising at least two programmable circuits and at least one host system able to communicate with the programmable system for controlling the observation and use of at least a part of the internal signals in the at least two programmable circuits, wherein the device further comprises:

- at least two local storage units configured to store internal signals observed in the at least two programmable circuits, each local storage unit being connected via at least one interface to the at least two programmable circuits,
- at least one logic unit external to the at least two programmable circuits and within said programmable system, said at least one logic unit configured to control and exchange data between said at least one host system and said at least one interface as well as said at least one programmable circuit associated with said at least one interface, wherein the observation and use of at least a part of the internal signals of each programmable circuit connected to said at least one logic unit configured to control and exchange data is controlled by said at least one host system and implemented from said at least one associated local storage unit, and
- at least one processing and control unit connected to said at least one host system configured to process, via said at least one logic unit, internal signals within the at least two programmable circuits in order to reduce the number of signals to be transmitted to said at least one host system, wherein the at least one processing and control unit is further configured to communicate between said at least one host system and said at least two local storage units and create an index of the internal signals in each of the least two programmable circuits associated with said at least one interface with respect to each of the at least two local storage units, and wherein the index indicates which of the at least two local storage units stores a value corresponding to at least one of the internal signals to be observed, internal to the at least two programmable circuits.

2. The observation and use device according to claim 1, wherein the device also comprises at least two programmable circuits connected via an interconnection network.

3. The observation and use device according to claim 1, comprising at least two interfaces, wherein at least two interfaces are connected via an interconnection network.

4. The observation and use device according to claim 1, wherein each programmable circuit of the programmable system is associated via at least one interface with at least one local storage unit.

5. The observation and use device according to claim 1, comprising at least two programmable circuits, wherein at least two programmable circuits among the at least two programmable circuits are connected to the same local storage unit via the same interface.

6. The observation and use device according to claim 1, wherein the programmable system also comprises at least one processor equipped with a logic control unit for performing specific tasks.

7. The observation and use device according to claim 1, wherein at least one programmable circuit comprises at least one routing placement processor.

8. The observation and use device according to claim 1, wherein at least part of at least one local storage unit is used for storing at least one stimulus in order to excite at least one circuit among a programmable circuit and a processor.

9. The observation and use device according to claim 1, wherein at least one local storage unit is of the volatile memory type.

10. The observation and use device according to claim 1, wherein at least one connection among the connections between the elements making up the device is a fast connection with a rate greater than 1 gigabit/second.

11. The observation and use device according to claim 1, wherein at least one connection among the connections between the elements making up the device is a wireless connection with a rate greater than 1 gigabit/second.

12. The observation and use device according to claim 1, wherein said at least one processing and control unit also comprises means of processing the values of the internal signals of at least one programmable circuit.

13. The observation and use device according to claim 12, wherein the means of processing the said values of the internal signals also recover the ranges of values of signals stored on at least one local storage unit.

14. The observation and use device according to claim 12, wherein the means of processing the values of the internal signals also perform at least one operation on the values of the signals stored on at least one local storage unit.

15. The observation and use device according to claim 12, wherein the means of processing the values of the internal signals also perform consolidation of operations performed using the values of signals stored on at least one local storage unit.

16. The observation and use device according to claim 12, wherein the processing of the internal signals is performed in parallel on the at least one local storage unit.

17. A device for observing and using internal signals in a programmable system, the device consisting of a programmable system comprising at least two programmable circuits and at least one host system able to communicate with the programmable system for controlling the observation and use of at least a part of the internal signals in the at least two programmable circuits, wherein the device further comprises:

- at least two local storage units configured to store internal signals observed in said at least two programmable circuits, each programmable circuit being associated via at least one interface with the at least one local storage unit,
- at least one logic unit external to the at least two programmable circuits and within said programmable system, said at least one logic unit configured to control and exchange data between said at least one host system and said at least one interface as well as said at least one programmable circuit associated with said at least one interface, the observation and use of at least a part of the internal signals of each programmable circuit connected to said at least one logic unit configured to control and exchange data is controlled by said at least one host system and implemented from said at least one associated local storage unit, and
- at least one processing and control unit connected to said at least one host system configured to process, via said at least one logic unit, internal signals within the at least two programmable circuits in order to reduce a number of signals to be transmitted to said at least one host system, wherein the at least one processing and control unit is further configured to communicate between said at least one host system and said at least two local storage units and create an index of the internal signals in each of the least two programmable circuits associated with said at least one interface with respect to each of the at least two local storage units, and wherein the index indicates which of the at least two local storage units stores a value corresponding to at least one of the internal signals to be observed, internal to the at least two programmable circuits.

* * * * *